(12) United States Patent
Kang et al.

(10) Patent No.: US 7,821,001 B2
(45) Date of Patent: Oct. 26, 2010

(54) ORGANIC ELECTRONIC DEVICE

(75) Inventors: Minsoo Kang, Daejeon (KR); Sae Hwan Son, Daejeon (KR); Hyeon Choi, Daejeon (KR); Jun Gi Jang, Cheongju (KR); Sang Young Jeon, Seoul (KR); Yeon Hwan Kim, Goyang (KR); Seokhee Yoon, Daejeon (KR); Young Kyu Han, Daejeon (KR)

(73) Assignee: LG Chem, Ltd., Seoul (KR)

( * ) Notice: Subject to any disclaimer, the term of this patent is extended or adjusted under 35 U.S.C. 154(b) by 18 days.

(21) Appl. No.: 12/149,179

(22) Filed: Apr. 28, 2008

(65) Prior Publication Data

US 2008/0272369 A1     Nov. 6, 2008

Related U.S. Application Data

(62) Division of application No. 11/126,769, filed on May 11, 2005, now Pat. No. 7,365,360.

(30) Foreign Application Priority Data

May 11, 2004    (KR) ..................... 10-2004-0033045

(51) Int. Cl.
    *H01L 51/30*    (2006.01)
(52) U.S. Cl. ............. 257/40; 257/E51.006; 257/E51.05
(58) Field of Classification Search .................. 257/40, 257/E51.001–E51.052; 438/99
    See application file for complete search history.

(56) References Cited

U.S. PATENT DOCUMENTS 5,343,050 A    8/1994    Egusa et al.
(Continued)

FOREIGN PATENT DOCUMENTS

EP    1 538 684    6/2005
(Continued)

OTHER PUBLICATIONS

Hajaouli, R., et al. "Improved Field-Effect Mobility in Short Oligothiophenes: Quaterthiophene and Quinquethiophene." Adv. Mater., vol. 9, No. 5 (1997): pp. 389-391.*
(Continued)

*Primary Examiner*—Matthew W Such
(74) *Attorney, Agent, or Firm*—McKenna Long & Aldridge LLP (57) ABSTRACT

An organic electronic device. The device includes a first electrode to inject or extract hole, the first electrode including a conductive layer and an n-type organic compound layer disposed on the conductive layer, a second electrode to inject or extract electron, a p-type organic compound layer disposed between the n-type organic compound layer and the second electrode. The p-type organic compound layer forms an NP junction between the n-type organic compound layer and the p-type organic compound layer. The energy difference between a lowest unoccupied molecular orbital (LUMO) energy of the n-type organic compound layer and a Fermi energy of the conductive layer is about 2 eV or less, and the energy difference between the LUMO energy of the n-type organic compound layer and a highest unoccupied molecular orbital (HOMO) energy of the p-type organic compound layer is about 1 eV or less.

1 Claim, 7 Drawing Sheets

U.S. PATENT DOCUMENTS

| | | | |
|---|---|---|---|
| 5,898,190 | A | 4/1999 | Iwata |
| 6,316,098 | B1 | 11/2001 | Yitzchaik et al. |
| 6,436,559 | B1 | 8/2002 | Ueno et al. |
| 6,541,908 | B1 | 4/2003 | Cheung et al. |
| 6,580,027 | B2 | 6/2003 | Forrest et al. |
| 6,720,572 | B1 | 4/2004 | Jackson et al. |
| 6,806,124 | B2 * | 10/2004 | Klauk et al. ............... 438/149 |
| 6,953,947 | B2 * | 10/2005 | Son et al. ................... 257/40 |
| 2002/0158242 | A1 | 10/2002 | Son et al. |
| 2002/0176992 | A1 | 11/2002 | Parthasarathy et al. |
| 2003/0170491 | A1 | 9/2003 | Liao et al. |
| 2003/0189401 | A1 | 10/2003 | Kido et al. |
| 2004/0113547 | A1 | 6/2004 | Son et al. |
| 2004/0178325 | A1 | 9/2004 | Forrest et al. |
| 2005/0042548 | A1 * | 2/2005 | Klauk et al. ............... 430/311 |
| 2005/0045917 | A1 | 3/2005 | Yamazaki et al. |
| 2005/0098207 | A1 | 5/2005 | Matsumoto et al. |
| 2006/0152833 | A1 | 7/2006 | Halls et al. |

FOREIGN PATENT DOCUMENTS

| | | |
|---|---|---|
| JP | 2000-223276 | 8/2000 |
| JP | 2002-252085 | 6/2002 |
| KR | 1999-0036644 | 5/1999 |
| KR | 2000-0065694 | 11/2000 |
| KR | 2001-0060821 | 7/2001 |
| WO | WO 01/84644 | 11/2001 |
| WO | WO 03/070822 | 8/2003 |
| WO | WO 03/100880 | 12/2003 |
| WO | WO 2004/112162 | 12/2004 |

OTHER PUBLICATIONS

Knupfer, M. and Liu, X. "Interface Electronic Properties of Oligothiophenes: The Effect of Chain Length and Chemical Substituents." Surf. Sci., vol. 600 (2006): pp. 3978-3981.*

Harada, N., et al. "Interchromophoric Homoconjugation Effect and Intramolecular Charge-Transfer Transition of the Triptycene System Containing a Tetracyanoquinodimethane Chromophore." J. Chem. Soc. Perkin Trans. II, No. 10 (1989): pp. 1449-1453.*

Pfeiffer, M., et al. "Controlled Doping fo Phthalocyanine Layers by Cosublimation with Acceptor Molecules: A Systematic Seebeck and Conductivity Study." Appl. Phys. Lett., vol. 73, No. 22 (1998): pp. 3202-3204.*

Hajaouli, R., et al. "Improved Field-Effect Mobility in Short Oligothiophenes: Quaterthiophene and Quinquethiophene." Adv. Mater., vol. 9, No. 5 (1997): pp. 389-391.*

Pfeiffer, M., et al. "Controlled Doping fo Phthalocyanine Layers by Cosublimation with Acceptor Molecules: A Systematic Seebeck and Conductivity Study." Appl. Phys. Lett., vol. 73, No. 22 (1998): pp. 3202-3204.*

Gao, W. & Kahn, A. "Controlled p-doping of Zinc Phthalocyanine by Coevaporation with Tetrafluorotetracyanoquinomethante: A Direct and Inverse Photoemission Study." Appl. Phys. Lett., vol. 79, No. 24 (2001): pp. 4040-4042.*

Knupfer, M. and Liu, X. "Interface Electronic Properties of Oligothiophenes: The Effect of Chain Length and Chemical Substituents." Surf. Sci., vol. 600 (2006): pp. 3978-3981.*

Garnier, F. "Thin-Film Transistors Based on Organic Conjugated Semiconductors." Chem. Phys., vol. 227 (1998): pp. 253-262.*

Hirose, Y., et al. "Chemistry and Electronic Properties of Metal-Organic Semiconductor Interfaces: Al, Ti, In, Sn, Ag, and Au on PTCDA." Phys. Rev. B, vol. 54, No. 19 (Nov. 15, 1996): pp. 13748-13758.*

Ishii et al., "Energy Level Alignment and Interfacial Electronic Structures at Organic/Metal and Organic/Organic Interfaces", Advances Materials, vol. 11, No. 8, 1999, pp. 605-625.

* cited by examiner

ORGANIC ELECTRONIC DEVICE

This application is a Divisional of application Ser. No. 11/126,769 filed May 11, 2005 now U.S. Pat. No. 7,365,360, which is hereby incorporated by reference as if fully set forth herein.

This application claims the benefit of Korean Patent Application No. 10-2004-0033045, filed on May 11, 2004, in the Korean Intellectual Property Office, the disclosure of which is incorporated herein in its entirety by reference.

BACKGROUND OF THE INVENTION

1. Field of the Invention

The present invention relates to electronic devices having an n-type organic compound layer in an electrode for hole injection or hole extraction. More particularly, the present invention relates to electronic devices capable of lowering the energy barriers for hole injection or hole extraction.

2. Description of the Related Art

Electronic devices such as solar batteries, organic luminescence devices, or organic transistors include two electrodes and an organic compound disposed between the electrodes. Solar batteries, for example, generate electricity by using the electrons and holes separated from exciton generated in organic compound layers in response to solar energy. Organic luminescence devices inject electrons and holes into the organic compound layer from two electrodes to convert electric currents into visible light. Organic transistors transport the holes or electrons generated in organic compound layers between a source electrode and a drain electrode in response to the voltage applied to a gate. Electronic devices may further include an electron/hole injection layer, an electron/hole extraction layer, or an electron/hole transporting layer in order to improve performance.

The interface between electrodes having a metal, a metal oxide, or a conductive polymer, and an organic compound layer, however, is unstable. An external heat, an internally generated heat, or the electric field applied to the electronic devices could adversely affect the performance of electronic devices. A driving voltage of electronic devices could be increased by the conductive energy difference between an electron/hole injection layer or an electron/hole transporting layer and an organic compound layer. Therefore, it is important to stabilize the interface between the electron/hole injection layer or the electron/hole transporting layer and the organic compound layer, as well as minimizing the energy barrier for injecting/extracting electron/hole into/from electrodes.

Electronic devices have been developed to control the energy difference between electrodes and an organic compound layer disposed between the electrodes. In a case of organic luminescence devices, an anode electrode is controlled to have a Fermi energy similar to the Highest Occupied Molecular Orbital (HOMO) energy of a hole injection layer, or a compound having the HOMO energy similar to the Fermi energy of the anode electrode is selected for the hole injection layer. Because the hole injection layer should be selected in view of the HOMO energy of the hole transporting layer or light emitting layer, in addition to the Fermi energy of the anode electrode, there is limitation in choosing compounds for the hole injection layer.

Therefore, a method for controlling the Fermi energy of an anode electrode has been generally adopted in manufacturing organic luminescence devices. Compounds for anode electrode, however, are limited. Organic transistors, for example, have used gold or novel metals for a source/drain electrode. Such gold or novel metals, however, are expensive and hard to process using industrial methods, thus restricting their application and structure in organic transistors.

SUMMARY OF THE INVENTION

According to an aspect of the present invention, an electronic device comprises: a first electrode to inject or extract hole, the first electrode including a conductive layer and an n-type organic compound layer disposed on the conductive layer; a second electrode to inject or extract electron; and a p-type organic compound layer disposed between the n-type organic compound layer of the first electrode and the second electrode, the p-type organic compound layer forming an NP junction between the n-type organic compound layer of the first electrode and the p-type organic compound layer, wherein an energy difference between a lowest unoccupied molecular orbital (LUMO) energy of the n-type organic compound layer of the first electrode and a Fermi energy of the conductive layer of the first electrode is about 2 eV or less; and wherein an energy difference between the LUMO energy of the n-type organic compound layer of the first electrode and a highest unoccupied molecular orbital (HOMO) energy of the p-type organic compound layer is about 1 eV or less.

According to another aspect of the present invention, an organic luminescence device comprises an anode including a conductive layer and an n-type organic compound layer disposed on the conductive layer; a cathode; and a p-type organic compound layer disposed between the n-type organic compound layer of the anode and the cathode, the p-type organic compound layer forming an NP junction between the n-type organic compound layer of the anode and the p-type organic compound layer, wherein an energy difference between a LUMO energy of the n-type organic compound layer of the anode and a Fermi energy of the conductive layer of the anode is about 2 eV or less; and wherein an energy difference between the LUMO energy of the n-type organic compound layer of the anode and a HOMO energy of the p-type organic compound layer is about 1 eV or less.

According to another aspect of the present invention, an organic solar battery comprises: an anode including a conductive layer and an n-type organic compound layer disposed on the conductive layer; a cathode; and an electron donor layer disposed between the n-type organic compound layer of the anode and the cathode, the electron donor layer including a p-type organic compound layer and forming an NP junction between the n-type organic compound layer of the anode and the p-type organic compound layer, wherein an energy difference between a LUMO energy of the n-type organic compound layer of the anode and a Fermi energy of the conductive layer of the anode is about 2 eV or less; and wherein an energy difference between the LUMO energy of the n-type organic compound layer of the anode and a HOMO energy of the p-type organic compound layer is about 1 eV or less.

According to further aspect of the present invention, an organic transistor comprising: a source electrode; a drain electrode; a gate; an insulating layer disposed on the gate; a p-type organic compound layer disposed on the insulating layer; and an n-type organic compound layer disposed between the source electrode or the drain electrode and the p-type organic compound layer, an NP junction being formed between the n-type organic compound layer and the p-type organic compound layer, wherein an energy difference between a LUMO energy of the n-type organic compound layer and a Fermi energy of the source electrode or the drain electrode is about 2 eV or less; and wherein an energy difference between the LUMO energy of the n-type organic compound layer and a HOMO energy of the p-type organic compound layer is about 1 eV or less.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, wherein:

FIGS. 1 (a) and (b) respectively show the energy levels of a first electrode for hole injection or hole extraction in an electronic device according to an exemplary embodiment of the present invention, before and after employing an n-type organic compound layer into the first electrode;

DETAILED DESCRIPTION OF THE INVENTION

In the following detailed description, only the preferred embodiment of the invention has been shown and described, simply by way of illustration of the best mode contemplated by the inventors of carrying out the invention. As will be realized, the invention is capable of modification in various obvious respects, all without departing from the invention. Accordingly, the drawings and description are to be regarded as illustrative in nature, and not restrictive.

The electronic device according to an exemplary embodiment of the present invention includes a first electrode to inject or extract holes, a second electrode to inject or extract electrons, and an organic compound layer having p-type semiconductor property (hereinafter "p-type organic compound layer") disposed between the first and second electrodes. The p-type organic compound includes a hole injection layer, a hole transporting layer, or an emitting layer. The electronic device may further include at least one organic compound disposed between the p-type organic compound layer and the second electrode.

The first electrode includes a conductive layer and an organic compound layer having an n-type semiconductor property (hereinafter "n-type organic compound layer") disposed on the conductive layer. The conductive layer includes metal, metal oxide, or a conductive polymer. The conductive polymer may include an electrically conductive polymer. The n-type organic compound layer has a predetermined LUMO energy, with respect to the Fermi energy of the conductive layer and the HOMO energy of the p-type organic compound layer.

The n-type organic compound layer of the first electrode is chosen to decrease the energy difference between the LUMO energy of the n-type organic compound layer of the first electrode and the Fermi energy of the conductive layer of the first electrode and the energy difference between the LUMO energy of the n-type organic compound layer and the HOMO energy of the p-type organic compound layer. Therefore, holes are easily injected into the HOMO energy of the p-type organic compound layer through the LUMO energy of the n-type organic compound layer of the first electrode. Alternatively, holes are easily extracted through the LUMO energy of the n-type organic compound layer of the first electrode from the HOMO energy of the p-type organic compound layer.

The energy difference between the LUMO energy of the n-type organic compound layer of the first electrode and the Fermi energy of the conductive layer of the first electrode, for example, is about 2 eV or less, specifically about 1 eV or less. The energy difference between the LUMO energy of the n-type organic compound of the first electrode and the HOMO energy of the p-type organic compound layer is about 1 eV or less, specifically about 0.5 eV or less.

When the energy difference between the LUMO energy of the n-type organic compound layer of the first electrode and the Fermi energy of the conductive layer of the first electrode is greater than about 2 eV, the effect of surface dipole or gap state on the energy barrier for hole injection or hole extraction is diminished. When the energy difference between the LUMO energy of the n-type organic compound layer and the HOMO energy of the p-type organic compound layer is greater than about 1 eV, the NP junction between the p-type organic compound layer and the n-type organic compound layer of the first electrode is not easily generated, thereby raising a driving voltage for hole injection or hole extraction.

Figure 1:
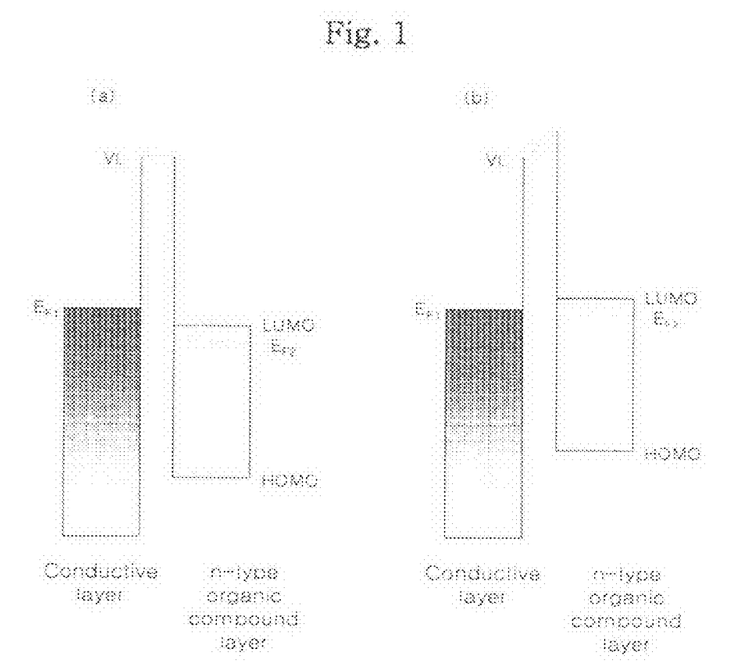

FIGS. 1(a) and (b) respectively show the energy levels of the first electrode for hole injection or hole extraction according to an exemplary embodiment of the present invention, before and after employing the n-type organic compound layer in the first electrode. The conductive layer has a higher Fermi energy ($E_{F1}$) than the Fermi energy ($E_{F2}$) of the n-type organic compound layer (a). Vacuum Level (VL) indicates the energy level at which electron freely moves in the conductive layer and the n-type organic compound layer.

When the electronic device employs the n-type organic compound layer as a portion of the first electrode, the conductive layer makes contact with the n-type organic compound layer. The electron moves from the conductive layer to the n-type organic compound layer so that the Fermi energies ($E_{F1,2}$) of the two layers are the same (b). As a result, surface dipole is formed on the interface between the conductive layer and the n-type organic compound layer, and the VL level, the Fermi energy, HOMO energy, and LUMO energy of the first electrode is changed as shown in FIG. 1(b).

Therefore, although the energy difference between the Fermi energy of the conductive layer and the LUMO energy of the n-type organic compound layer is big, the energy barrier for hole injection or hole extraction can be reduced by contacting the conductive layer and the n-type organic compound layer. Further, when the conductive layer has a Fermi energy greater than a LUMO energy of the n-type organic compound layer, the electrons move from the conductive layer to the n-type organic compound layer, thereby forming gap state at the interface of the conductive layer and the n-type organic compound layer. Thus, the energy barrier for transporting electrons is minimized.

The n-type organic compound layer includes, but not limited to, 2,3,5,6-Tetrafluoro-7,7,8,8-tetracyanoquinodimethane (F4TCNQ) having LUMO energy of about 5.24 eV, fluoro-substituted 3,4,9,10-Perylenetetracarboxylic dianhydride (PTCDA), cyano-substituted PTCDA, naphthalene-tetracarboxylic-dianhydride (NTCDA), fluoro-substituted NTCDA, or cyano-substituted NTCDA.

Figure 2:
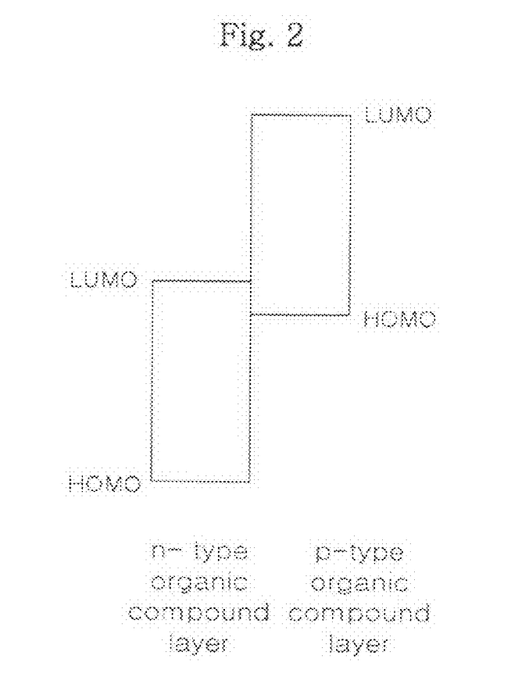
FIG. 2 shows a NP junction formed between an n-type organic compound layer of a first electrode for hole injection or hole extraction and a p-type organic compound layer in an electronic device according to an exemplary embodiment of the present invention.

The electronic device according to an exemplary embodiment of the present invention includes a p-type organic compound layer contacting the n-type organic compound layer of the first electrode for hole injection or hole extraction. Therefore, an NP junction is formed in the electronic device. FIG. 2 shows the NP junction formed between the n-type organic compound layer of the first electrode and the p-type organic compound layer.

The energy difference between the LUMO energy of the n-type organic compound layer of the first electrode and the HOMO energy of the p-type organic compound layer is reduced when the NP junction is generated. Therefore, electrons or holes are easily generated in response to an external voltage or light. The holes in the p-type organic compound layer or the electrons in the n-type organic compound layer of the first electrode are also easily generated due to the NP junction. Because the electrons and holes are generated together at the NP junction, the electrons are transported to the conductive layer of the first electrode through the n-type organic compound layer of the first electrode and the holes are transported to the p-type organic compound layer.

In order that the NP junction effectively transports the holes to the p-type organic compound layer, the difference between the LUMO energy of the n-type organic compound layer of the first electrode and the HOMO energy of the p-type organic compound layer has a predetermined level. The difference between the LUMO energy of the n-type organic compound layer of the first electrode and the HOMO energy of the p-type organic compound layer, for example, is about 1 eV or less, specifically about 0.5 eV or less.

The electronic device according to exemplary embodiments of the present invention includes, but not limited to, an organic luminescence device, an organic solar battery, or an organic transistor.

Organic Luminescence Device

Figure 3:
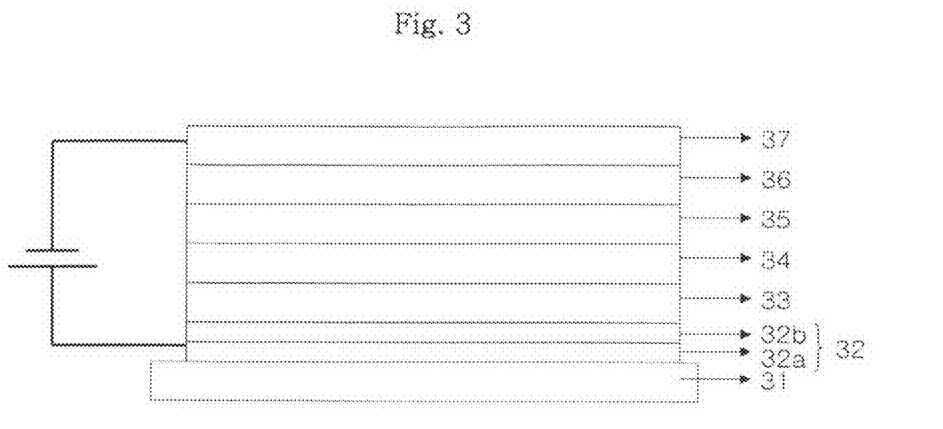
FIG. 3 is a schematic sectional view showing an organic luminescence device according to an exemplary embodiment of the present invention.

Organic luminescence devices include an anode, a cathode, and a p-type organic compound layer disposed between the anode and the cathode. The p-type organic compound layer includes a hole injection layer, a hole transporting layer, or an emitting layer. Organic luminescence devices further include at least one organic compound layer disposed between the p-type organic compound layer and the cathode. When the organic luminescence device includes a plurality of the organic compound layers, the organic compound layers may be formed of the same material or different materials. FIG. 3 shows an organic luminescence device according to an exemplary embodiment of the present invention.

Referring to FIG. 3, an organic luminescence device includes a substrate 31, an anode 32 disposed on the substrate 31, a p-type hole injection layer (HIL) 33 disposed on the anode 32 and to receive holes from the anode 32, a hole transporting layer (HTL) 34 disposed on the hole injection layer 33 and to transport the holes to an emitting layer (EML) 35, the emitting layer 35 disposed on the hole transporting layer 34 and to emit light by using the electrons and holes, and an electron transporting layer (ETL) 36 disposed on the emitting layer 35 and to transport the electrons from a cathode 37 to the emitting layer 35, and the cathode 37 disposed on the electron transporting layer 36. The hole transporting layer 34, the emitting layer 35, or the electron transporting layer 36 may be formed of the same organic compound or different organic compounds.

According to another exemplary embodiment of the present invention, an organic luminescence device may include a substrate 31, an anode 32 disposed on the substrate 31, a p-type hole transporting layer 34 disposed on the anode 32, an emitting layer 35 disposed on the hole transporting layer 34, an electron transporting layer 36 disposed on the emitting layer 35, and a cathode 37 disposed on the electron transporting layer 36. The emitting layer 35 or the electron transporting layer 36 may be formed of the same organic compound or different organic compounds.

According to further exemplary embodiment of the present invention, an organic luminescence device may include a substrate 31, an anode 32 disposed on the substrate 31, a p-type emitting layer 35 disposed on the anode 32, an electron transporting layer 36 disposed on the emitting layer 35, and a cathode 37 disposed on the electron transporting layer 36. The electron transporting layer 36 may be formed of organic compound.

Still referring to FIG. 3, the anode 32 transports holes to the hole injection layer 33, the hole transporting layer 34, or the emitting layer 35, and includes a conductive layer 32a and an n-type organic compound layer 32b. The conductive layer 32a is formed of metal, metal oxide, or a conductive polymer. The conductive polymer may further include an electrically conductive polymer. The energy difference between the LUMO energy of the n-type organic compound layer 32b and the Fermi energy of the conductive layer 32a is about 2 eV or less, specifically, about 1 eV or less. The energy difference between the LUMO energy of the n-type organic compound layer 32b and the HOMO energy of the p-type hole injection layer 33 is about less 1 eV or less, specifically about 0.5 eV or less. An NP junction is formed between the n-type organic compound layer 32b of the anode 32 and the p-type hole injection layer 33.

When the hole transporting layer 34 or the emitting layer 35 is formed of the p-type organic compound according to another exemplary embodiment of the present invention, the energy difference between the LUMO energy of the n-type organic compound layer 32b and the HOMO energy of the p-type hole transporting layer 34, or the p-type emitting layer 35 is about 1 eV or less, specifically about 0.5 eV or less. The NP junction is formed between the n-type organic compound layer 32a of the anode 32 and the p-type hole transporting layer 34, or the p-type emitting layer 35.

When the energy difference between the LUMO energy of the n-type organic compound layer 32b and the Fermi energy of the conductive layer 32a is greater than about 2 eV, the effect of surface dipole or gap state on the energy barrier for hole injection to the p-type injection layer 33 is diminished. When the energy difference between the LUMO energy of the n-type organic compound layer 32b and the HOMO energy of the p-type hole injection layer 33 is greater than about 1 eV, holes or electrons are not easily generated in the p-type hole injection layer 33 or the n-type organic compound layer 32b, respectively. Therefore, a driving voltage for the hole injection is raised.

Figure 4:
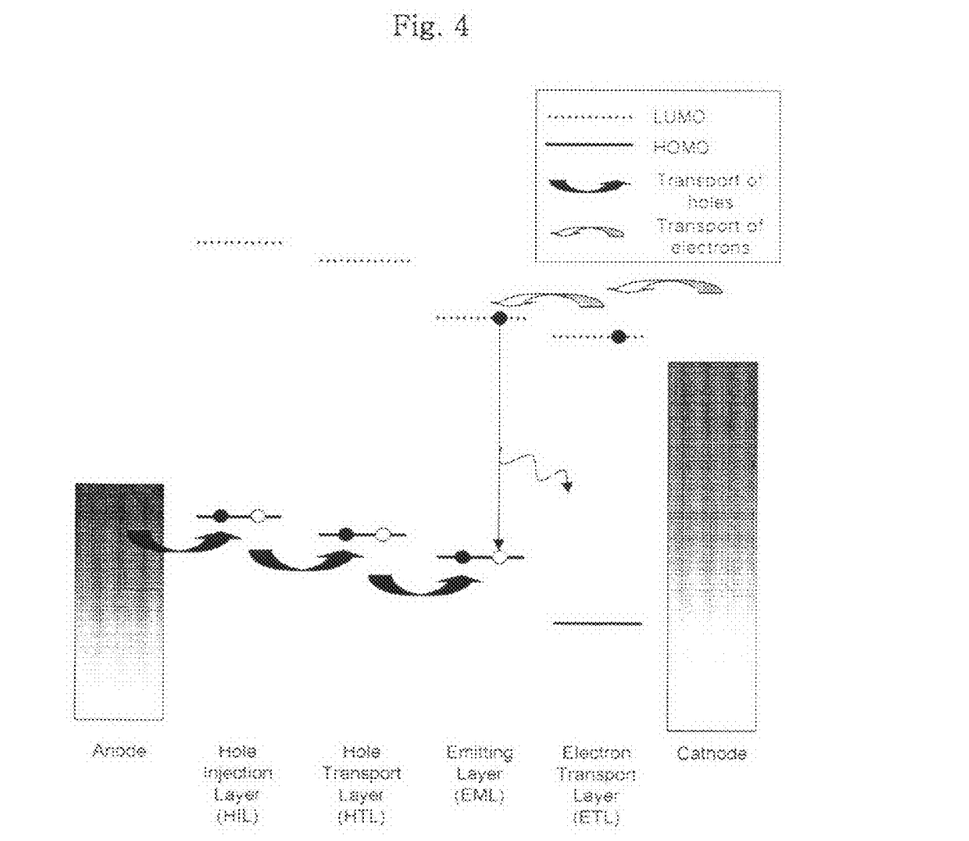
FIG. 4 shows an ideal energy level of an organic luminescence device.
Figure 5:
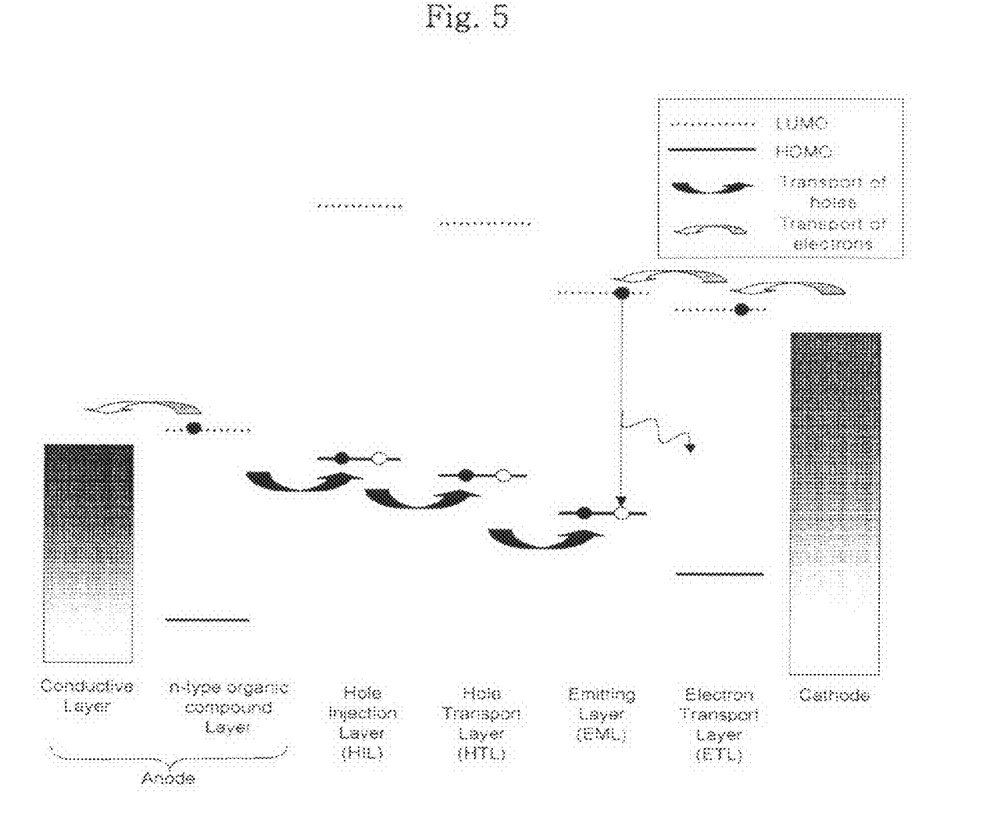
FIG. 5 shows an energy level of an organic luminescence device according to an exemplary embodiment of the present invention.

FIG. 4 shows an ideal energy level of an organic luminescence device. With this energy level, the energy loss for injecting the holes and electrons from the anode and the cathode is minimized, respectively. FIG. 5 shows an energy level of an organic luminescence device according to an exemplary embodiment of the present invention.

Referring to FIG. 5, an organic luminescence device according to another exemplary embodiment of the present invention includes an anode having a conductive layer and an n-type organic compound layer (shown in FIG. 3), a p-type hole injection layer (HIL), a hole transporting layer (HTL), an emitting layer (EML), an electron transporting layer (ETL), and a cathode. The energy difference between the LUMO energy of the n-type organic compound layer of an anode and the Fermi energy of the conductive layer of the anode is about 2 eV or less and the energy difference between the LUMO energy of the n-type organic compound layer of the anode and the HOMO energy of the p-type hole injection layer is about 1 eV or less. Because the energy barriers for hole/electron injection or extraction are lowered by the n-type organic compound layer of the anode, the holes are easily transported from the anode to the emitting layer by using the LUMO energy of the n-type organic compound layer of the anode and the HOMO energy of the p-type hole injection layer.

Because the n-type organic compound layer of the anode lowers the energy barrier for injecting holes from the anode to the p-type hole injection layer, the p-type hole transporting layer or the p-type emitting layer, the conductive layer of the anode can be formed of various conductive materials. The conductive layer, for example, can be formed of the same materials to the cathode. When the anode is formed of the same material to the cathode, such as, the conductive material having low work function, a stacked organic luminescence device can be manufactured.

Figure 8:
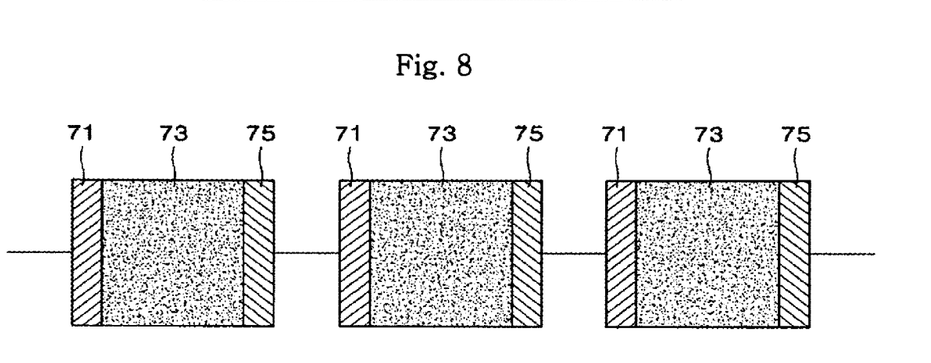
FIGS. 8 and 9 are schematic section views each showing a stacked organic luminescence device, according to an exemplary embodiment of the present invention, respectively.
Figure 9:
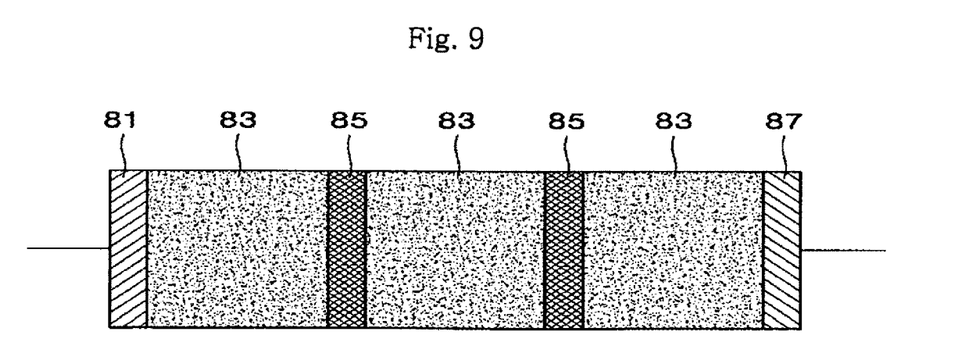

FIGS. 8 and 9 show stacked organic luminescence devices according to an exemplary embodiment of the present invention, respectively. Referring to FIG. 8, an anode 71 of an organic luminescence device is connected to a cathode 75 of adjacent organic luminescence device in serial. The anode 71 includes a conductive layer and an n-type organic compound layer.

Referring to FIG. 9, an organic luminescence device forms an equivalent structure in which a plurality of repeating units, each having an organic compound layer 83 and an intermediate conductive layer 85, is disposed between an anode 81 and a cathode 87. The intermediate conductive layer 85 includes a conductive layer and an n-type organic compound layer. The conductive layer is formed of a transparent material having a similar work function to that of the cathode 87 and a visible light transmission rate of about 50% or more. When a non-transparent material forms the conductive layer, the thickness of the conductive layer is thin enough to be transparent. The non-transparent material, for example, includes aluminum, silver, or copper. When Al forms the conductive layer of the intermediate conductive layer 85, the conductive layer, for example, has a thickness of about 5 to 10 nm. Because a brightness is increased in proportion to the number of the staked organic luminescence devices operated in response to the same driving voltage, the stacked organic luminescence device has an improved brightness.

Hereinafter, each layer of the organic luminescence device according to an exemplary embodiment of the present invention is illustrated. Each layer can be formed of a single compound or a combination of two or more compounds.

Anode

An anode injects holes into a p-type organic compound layer such as a hole injection layer, a hole transporting layer, or an emitting layer. The anode includes a conducive layer and an n-type organic compound layer. The conductive layer includes metal, metal oxide or a conductive polymer. The conductive polymer may include an electrically conductive polymer.

Because the n-type organic compound layer lowers the energy barrier for injecting holes to the p-type organic compound layer, the conductive layer can be formed of various conductive materials. The conductive layer, for example, has a Fermi energy of about 3.5 to 5.5 eV. As exemplary conductive material, there are carbon, aluminum, vanadium, chromium, copper, zinc, silver, gold, or alloy of the forgoing materials; zinc oxide, indium oxide, tin oxide, indium tin oxide (ITO), indium zinc oxide, and similar metal oxide; or a combination of oxide and metal, such as ZnO:Al or $SnO_2$:Sb. A top emission type organic luminescence device may use both a transparent material and a non-transparent material having high light reflectance as the conductive layer. A bottom emission type organic luminescence device uses a transparent material or a non-transparent material having a thin thickness as the conductive layer.

The n-type organic compound layer is disposed between the conductive layer and the p-type organic compound layer, and injects holes into the p-type organic compound layer under a low electric field. The n-type organic compound is selected so that the energy difference between the LUMO energy of the n-type organic compound layer of the anode and the Fermi energy of the conductive layer of the anode is about 2 eV or less, and the energy difference between the LUMO energy of the n-type organic compound layer of the anode and the HOMO energy of the p-type organic compound layer is about 1 eV or less.

The n-type organic compound layer, for example, has the LUMO energy of about 4 to 7 eV and the electron mobility of about $10^{-8}$ cm$^2$/Vs to 1 cm$^2$/Vs, specifically about $10^{-6}$ cm$^2$/Vs to $10^{-2}$ cm$^2$/Vs. When the electron mobility is less than about $10^{-8}$ cm$^2$/Vs, it is not easy to inject holes from the n-type organic compound layer into the p-type organic compound layer. When the electron mobility is greater than about 1 cm$^2$/Vs, such an organic compound is crystalline rather than amorphous. Such a crystalline organic compound is not easily used for organic EL device.

The n-type organic compound layer is formed by a vacuum deposition or solution process. The n-type organic compound layer includes, but not limited to, 2,3,5,6-tetrafluoro-7,7,8,8-tetracyanoquinodimethane (F4TCNQ), fluoro-substituted 3,4,9,10-perylenetetracarboxylic dianhydride (PTCDA), cyano-substituted PTCDA, naphthalene-tetracarboxylic-dianhydride (NTCDA), fluoro-substituted NTCDA, cyano-substituted NTCDA, or hexanitrile hexaazatriphenylene (HAT).

Hole Injection Layer (HIL) or Hole Transporting Layer (HTL)

Either the hole injection layer or the hole transporting layer can be formed of a p-type organic compound layer disposed between the anode and the cathode. Because the p-type hole injection layer or the p-type hole transporting layer and the n-type organic compound layer of the anode form an NP junction, the holes formed at the NP junction are transported to the emitting layer through the p-type hole injection layer or the p-type hole transporting layer.

The HOMO energy of the p-type hole injection layer or the p-type hole transporting layer has, for example, about 1 eV or less energy difference or about 0.5 eV or less energy difference, with respect to the LUMO energy of the n-type organic compound layer. The p-type hole injection layer or the p-type hole transporting layer includes, but not limited to, an arylamine compound, a conductive polymer, or a block copolymer having together conjugated portion and non-conjugated portion.

Emitting Layer (EML)

Because a hole transporting and an electron transporting are occurred at the same time in the emitting layer, the emitting layer has both p-type semiconductor property and n-type semiconductor property. The emitting layer has an n-type emitting layer in which the electron transporting is faster than the hole transporting, or a p-type emitting layer in which the hole transporting is faster than the electron transporting.

Because the electrons transporting is faster than the holes transporting in the n-type emitting layer, the light is emitted at the interface between the hole transporting layer and the emitting layer. It would be better that the LUMO energy of the hole transporting layer is greater than the LUMO energy of the emitting layer in order to have high luminescence efficiency. The n-type emitting layer includes, but not limited to, aluminum tris(8-hydroxyquinoline) ($Alq_3$); 8-hydroxyquinoline berillyum (BAlq); benzoxazole compound, benzothiazole compound, or benzimidazol compound; polyfluorene compound; or silacyclopentadiene (silole).

In the p-type emitting layer, the holes transport faster than electrons do, so that the light is emitted at the interface between the electron transporting layer and the emitting layer. Therefore, it would be better that HOMO energy of the electron transporting layer is lower than the HOMO energy of the emitting layer in order to have high luminescence efficiency.

The high luminescence efficiency obtained by changing the LUMO energy of the hole transporting layer in the p-type emitting layer is less than that in the n-type emitting layer. Therefore, the organic luminescence device having the p-type emitting layer may have the NP junction between the n-type organic compound layer and the p-type emitting layer without forming the hole injection layer and the hole transporting layer. The p-type emitting layer includes, but not limited to, a carbazole compound, an anthracene compound, a poly(phenylene vinylenes) (PPV), or a Spiro compound.

Electron Transporting Layer (ETL)

The electron transporting layer has a high electron mobility to easily receive and transport electrons from/to the cathode and the emitting layer. The electron transporting layer includes, but not limited to, aluminum tris(8-hydroxyquinoline) ($Alq_3$), organic compound having $Alq_3$ structure, flavone hydroxide-metal complex, or silacyclopentadiene (silole).

Cathode

The cathode has low work function in order to easily inject electrons into the p-type organic compound layer such as the hole transporting layer. The cathode includes, but not limited to, metal, such as, magnesium, calcium, sodium, kalium, titanium, indium, yttrium, lithium, gadolinium, aluminum, silver, tin, and lead or alloy thereof; or multiple structured materials such as LiF/Al or $LiO_2$/Al. The cathode can be formed of the same material to the conductive layer of the anode. Alternatively, either the cathode or the conductive layer of the anode includes a transparent material.

Organic Solar Battery

Figure 6:
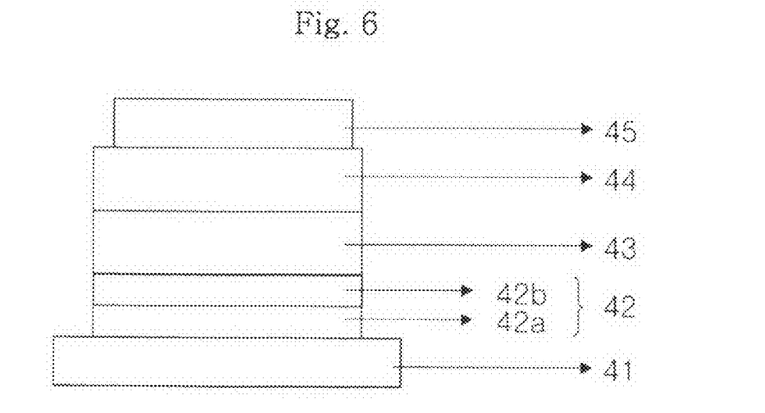
FIG. 6 is a schematic sectional view showing an organic solar battery according to an exemplary embodiment of the present invention.

Organic solar battery includes an anode, a cathode, and an organic thin film disposed between the anode and the cathode. The organic thin film includes a plurality of layers in order to improve the effectiveness and stability of the organic solar battery. FIG. 6 shows an organic solar battery according to an exemplary embodiment of the present invention.

Referring to FIG. 6, an organic solar battery includes a substrate 41, an anode 42 having a conductive layer 42a and an n-type organic compound layer 42b disposed on the substrate 41, an electron donor layer 43 disposed on the n-type organic compound layer 42b, an electron acceptor layer 44 disposed on the electron donor layer 43, and a cathode 45 disposed on the electron acceptor layer 44. In response to a photon from an external light, electrons and holes are generated between the electron donor layer 43 and the electron acceptor layer 44. The generated holes are transported to the anode 42 through the electron donor layer 43.

The electron donor layer 43 is formed of a p-type organic compound. The organic compound can be a combination of two or more compounds. Although not shown in the figures, the organic solar battery according to another exemplary embodiment of the present invention may further include additional organic thin films or omit any organic thin film to simplify the processing steps. The organic solar battery may further employ an organic compound having multiple functions to reduce the number of the organic thin films.

A conventional solar battery transports holes to an anode through the HOMO energy of an organic thin film such as an electron donor layer. Therefore, as the energy difference between the Fermi energy of the anode and the HOMO energy of the electron donor layer is smaller, the hole extraction is greater. The organic solar battery according to an exemplary embodiment of the present invention, however, includes the anode 42, having both the conductive layer 42a and the n-type organic compound layer 42b, to extract holes.

The energy difference between the LUMO energy of the n-type organic compound layer 42b and the Fermi energy of the conductive layer 42a is about 2 eV or less. The energy difference between the LUMO energy of the n-type organic compound layer 42b and the HOMO energy of the p-type organic compound such as the electron donor layer 43 is about 1 eV or less. An NP junction is formed between the n-type organic compound layer 42b and the electron donor layer 43, so that holes are easily extracted. The extracted holes are injected to the conductive layer 42a through the LUMO energy of the n-type organic compound layer 42b. Therefore, the conductive layer 42a can be formed of the materials having various Fermi energies, and the cathode 45 and the anode 42 can be formed of the same materials.

The conductive layer 42a and cathode 45 of the organic solar battery can be formed of the same materials for the conductive layer and cathode of the organic luminescence device. The same materials for the n-type organic compound layer of the organic luminescence device can form the n-type organic compound layer of the organic solar battery. The electron acceptor layer 44 can be formed of the materials for the electron transporting layer or n-type emitting layer of the organic luminescence device or a fullerene compound. The electron donor layer 43 can be formed of the materials for the p-type hole transporting layer or p-type emitting layer of the organic luminescence device, or a thiophene compound.

Organic Transistor

Figure 7:
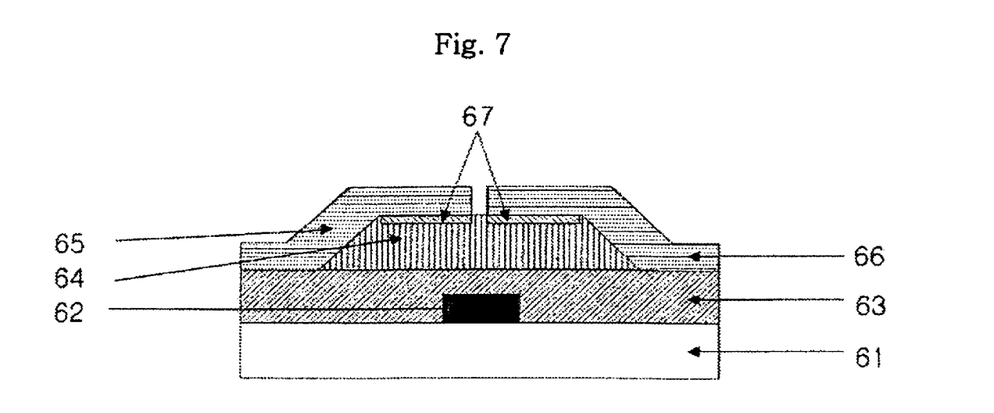
FIG. 7 is a schematic sectional view showing an organic transistor according to an exemplary embodiment of the present invention.

FIG. 7 shows an organic transistor according to an exemplary embodiment of the present invention. Referring to FIG. 7, the organic transistor includes a substrate 61, a source electrode 65, a drain electrode 66, a gate 62, an insulating layer 63 disposed on the gate 62 and the substrate 61, a p-type organic compound layer 64 disposed on the insulating layer 63 and forming holes, and an n-type organic compound layer 67 disposed between the source electrode 65 and/or drain electrode 66 and the p-type organic compound layer 64. The energy difference between the LUMO energy of the n-type organic compound layer 67 and the Fermi energy of the source electrode 65 or the drain electrode 66 is about 2 eV or less. The energy difference between the LUMO energy of the n-type organic compound layer 67 and the HOMO energy of the p-type organic compound layer 64 is about 1 eV or less.

The n-type organic compound layer 67 can extract the holes from the source electrode 65 and inject them to the drain electrode 66 via the LUMO energy of the n-type organic compound layer 67. Because the NP junction is formed between the n-type organic compound layer 67 and the p-type organic compound layer 64, the holes are easily transported between the source electrode 65 and the drain electrode 66. The n-type organic compound layer 67 can form a portion of the source electrode 65 or the drain electrode 66, according to another exemplary embodiment of the present invention. In this case, the materials having various Fermi energies can form the source electrode 65 or the drain electrode 66.

The n-type organic compound layer 67 can be formed of the same materials for the n-type organic compound layer of the organic luminescence device, according to an exemplary embodiment of the present invention. The gate 62 can be formed of the same materials for the anode or cathode of the organic luminescence device. The source electrode 65 or the drain electrode 66 can be formed of the same materials for the anode of the organic luminescence device. The p-type organic compound layer 64 includes, but not limited to, a pentacene compound, an antradithidphene compound, a benzodithiophene compound, thiophene oligomers, polythiophenes, mixed-subunit thiophene oligomers, or oxyfunctionalized thiophene oligomers. The insulating layer 63 can be formed of silicon oxide, or silicon nitride; or a polymer, such as, polyimide, Poly(2-vinylpyridine), Poly(4-vinylphenol), or poly(methylmethacrylate).

Various aspects and features of the present invention will be further discussed in terms of the examples. The following examples are intended to illustrate various aspects and features of the present invention, but not to limited the scope of the present invention.

Example 1

Determination of HOMO and LUMO Energies of HAT with UPS and UV-VIS Absorption

Hexanitrile hexaazatriphenylene (HAT) was used for an organic compound having n-type semiconductor property. The HOMO energy of the HAT was determined by Ultraviolet Photoelectron Spectroscopy (UPS) in which the Vacuum UV line (about 21.20 eV) emitted from a Helium lamp was illustrated to a sample under an ultra high vacuum ($<10^{-10}$ Torr) and the kinetic energy of the electrons emitted from the sample was examined.

With the UPS, the work function of metals and the ionization energy (HOMO energy and Fermi energy) of organic compounds were determined, respectively. The kinetic energy of the emitted electrons was the energy difference between the electron binding energy of the sample and the vacuum UV energy (about 21.2 eV). Therefore, the distribution of the binding energy of the materials contained in the sample was determined by analyzing the distribution of the kinetic energy of the emitted electrons. When the kinetic energy of the emitted electrons had a maximum value, the binding energy of the sample had a minimum value. The minimum value of the binding energy was used in determining the work function (Fermi energy) and the HOMO energy of the sample.

Figure 10:
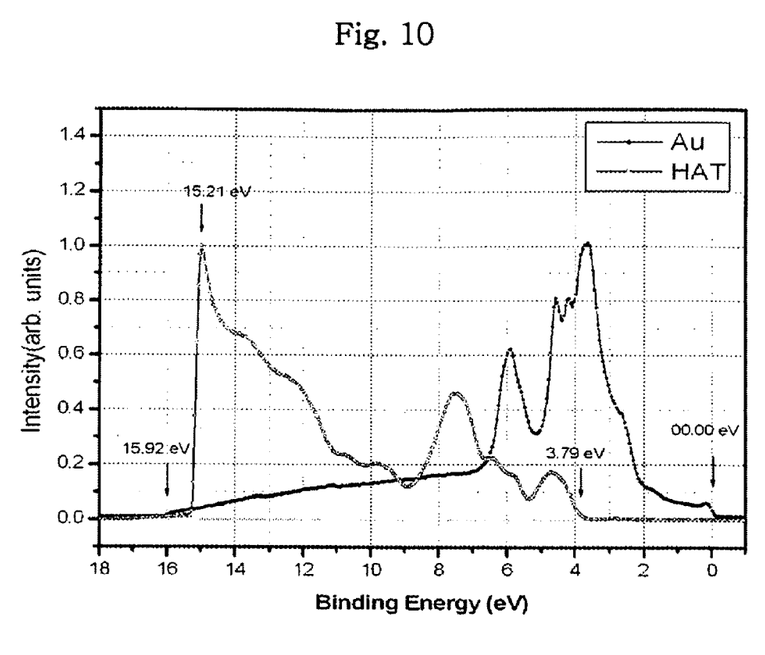
FIG. 10 is a graph showing UPS data of a gold film and a HAT film disposed on the gold film.

The work function of gold was determined by using a gold film. The HAT was vacuum deposited to the gold film, and the HOMO energy of the HAT was determined by analyzing the kinetic energy of the electrons emitted from the HAT. FIG. 10 is a graph showing UPS data of the gold (Au) film and the HAT film disposed on the gold film. H. Ishii, et al., *Advanced Materials*, 11, 605-625 (1999). The HAT film has a thickness of 20 nm.

Referring to FIG. 10, an X-axis indicates the binding energy (eV), which was determined, with respect to the work function of the gold film. The work function of the gold was about 5.28 eV, which was calculated by subtracting the maximum value (about 15.92 eV) of the binding energy from the energy (about 21.20 eV) of the light illustrated to the Au film. The HOMO energy of the HAT film was about 9.78 eV, which was calculated by subtracting the difference between the minimum value (about 3.79 eV) and the maximum value (about 15.21 eV) of the binding energy from the light energy (about 21.20 eV). The Fermi energy of the HAT film is about 6.02V.

Another UV-VIS spectrum was taken with the organic compound, which was formed by vacuum deposition of the HAT on a surface of a glass. The absorption edge was analyzed, and the band gap was determined to be about 3.26 eV. Therefore, the LUMO energy of the HAT was about 6.54 eV, which could be changed by an exciton binding energy. Because the HOMO energy of about 6.54 eV was greater than the Fermi energy of about 6.02 eV, the exciton binding energy had to have about 0.52 eV or more so that the LUMO energy was less than the Fermi energy. The exciton binding energy of an organic compound generally would be about 0.5 eV to about 1 eV, and thus the LUMO energy of the HAT would be about 5.54 to 6.02 eV.

Example 2

Hole Injection Characteristic of HAT

A glass substrate coated with the ITO having a thickness of 1000 Å was ultrasonic washed for thirty minutes in a distilled water in which a detergent was melted. Corning 7059 glass was used as the glass substrate, and the product 15-333-55 manufactured by Fischer Co. was used as the detergent. The glass substrate was further ultrasonically washed in the distilled water for ten minutes, which was repeated twice.

After washing, the glass substrate was sequentially ultrasonic washed for one minute in an isopropyl alcohol solvent, an acetone solvent, and a methanol solvent, and then dried. Then, the ITO coated glass substrate was treated by plasma for five minutes in a plasma cleaner by using nitrogen under a pressure of about 14 mtorr and a power of about 50 W. As a result, the work function of ITO was about 4.8 eV.

The HAT of about 100 Å was thermally deposited on the ITO electrode under vacuum to form an anode having an ITO conductive layer and an HAT n-type organic compound layer. Then, the 4,4'-bis[N-(1-naphthyl)-N-phenylamino]biphenyl (NPB) having a thickness of about 1500 Å, and the aluminum having a thickness of about 500 Å were sequentially vacuum-deposited to form a p-type hole transporting layer and a cathode, respectively. The result device was called "device A". The vacuum deposition rates of the organic compounds and the aluminum were about 0.4 to 0.7 Å/sec and about 2 Å/sec, respectively. The vacuum level of the vacuum deposition was about $2\times10^{-7}$ to $5\times10^{-8}$ torr.

Comparative Example 1

Figure 11:
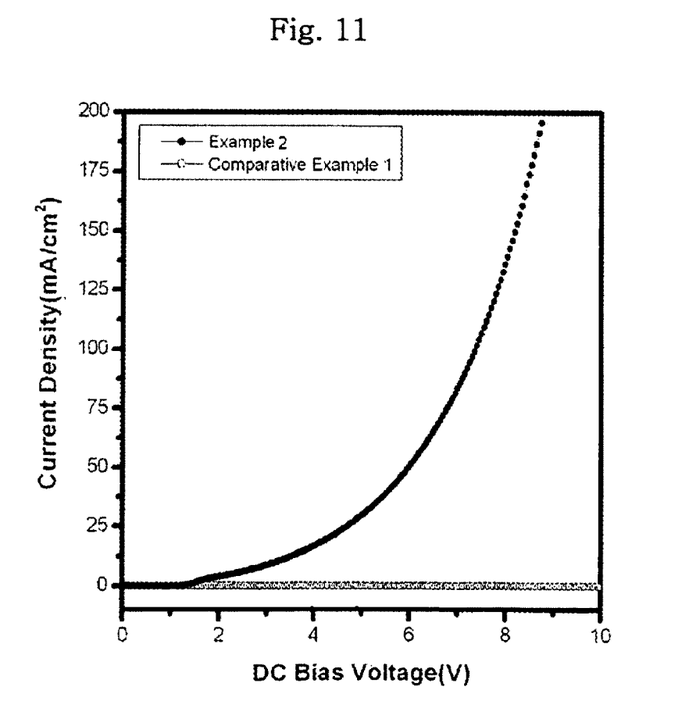
FIG. 11 is a graph showing the current-voltage characteristics of Example 2 and Comparative Example 1.

A "device B" was fabricated in the same manner as in Example 2 except for the absence of the HAT n-type organic compound layer. FIG. 11 is a graph showing current-voltage characteristics of the devices A and B of Example 2 and Comparative Example 1, respectively. Referring to FIG. 11, at the DC bias voltage of about 6V, the current density of the device A is about 40 mA/cm$^2$ or more, but the current density of the device B is about 10$^{-3}$ mA/cm$^2$ or less.

Because the work function (about 4.8 eV) of the ITO conductive layer was less than the LUMO energy (about 5.54 to 6.02 eV) of the HAT n-type organic compound layer, which was disposed between the NPB layer and the ITO conductive layer, the electrons transported from the ITO conductive layer to the HAT n-type organic compound layer, and then VL was changed as shown in FIG. 1(b). Therefore, the energy barrier between the ITO conductive layer and the HAT n-type organic compound layer was lowered, and the holes transported to the NPB layer through the electron transporting from the HOMO energy (about 5.4 eV) of the NPB layer to the LUMO energy (about 5.54 to 6.02 eV) of the HAT n-type organic compound layer. Therefore, the device A has higher current density at a predetermined voltage or more.

The device B, however, had a certain energy barrier for inserting holes between the work function (about 4.8 eV) of the ITO conductive layer and the HOMO energy (about 5.4 eV) of the NPB layer. Therefore, the current density in the device B did not increase even if higher voltage was applied to the device B.

Example 3

A glass substrate such as Corning 7059 glass was ultrasonically washed in a distilled water in which a detergent was dissolved. The product manufactured by Fischer Co. was used as the detergent, and the distilled water was twice filtered with the filter manufactured by Millipore Co. After washing the glass substrate for thirty minutes, the glass substrate was further ultrasonic washed in the distilled water for ten minutes, which was repeated twice.

After washing, the glass substrate was sequentially ultrasonically washed in an isopropyl alcohol solvent, an acetone solvent, and a methanol solvent, and then dried. Then, the Al having a thickness of about 500 Å was vacuum deposited on the glass substrate, and the HAT having a thickness of about 100 Å was heat and vacuum deposited on the Al conductive layer, thereby forming the anode having the Al conductive layer and the HAT n-type organic compound layer. Then, the 4,4'-bis[N-(1-naphthyl)-N-phenylamino]biphenyl (NPB) compound having a thickness of about 1500 Å, and the aluminum having a thickness of about 500 Å were sequentially heat and vacuum deposited to form a p-type hole transporting layer and a cathode, respectively.

The result device was called "device C". The vacuum deposition rates of the organic compounds and the aluminum were about 0.4 to 0.7 Å/sec and about 2 Å/sec, respectively. The vacuum level of the vacuum deposition was about 2×10$^{-7}$ to 5×10$^{-8}$ torr.

Comparative Example 2

Figure 12:
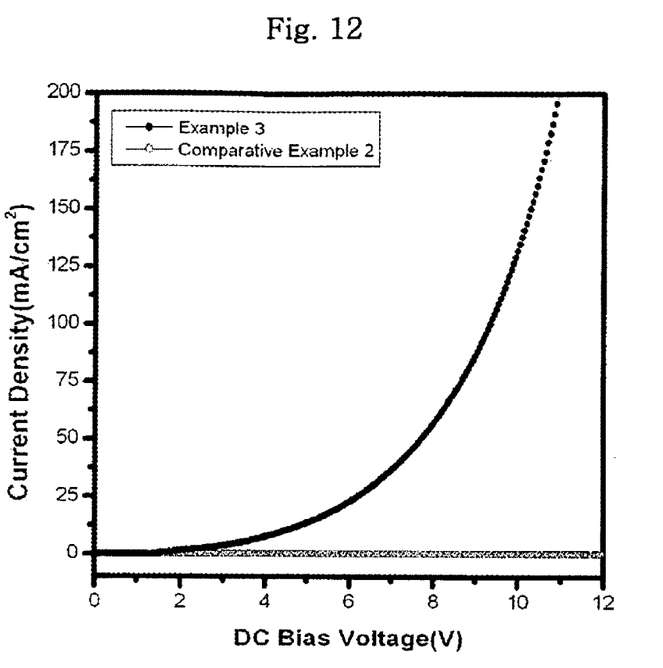
FIG. 12 is a graph showing the current-voltage characteristics of Example 3 and Comparative Example 2.

A "device D" was fabricated in the same manner as in Example 3 except for the absence of the HAT n-type organic compound layer. FIG. 12 is a graph showing current-voltage characteristics of the device C and D of Example 3 and Comparative Example 2, respectively. Referring to FIG. 12, at the DC bias voltage of about 6V, the current density of the device C was about 20 mA/cm$^2$ or more, but the current density of the device D was about 10$^{-3}$ mA/cm$^2$ or less.

Although the work function (about 4.2 eV) of the Al was lower than that (4.8 eV) of the ITO, the turn-on voltage of the device C was not changed, and the current density was increased as the voltage reached at a certain value. On the contrary, the device D showed a poor current-voltage characteristic, as shown in the device B. Therefore, the VL was changed in proportionate to the changing of the work function of the ITO or Al conductive layer, and the energy barrier for hole injection or hole extraction between the conductive layer and the NPB p-type organic compound layer through the HAT n-type organic compound layer was not changed a lot.

Example 4

Organic Luminescence Device Including an Anode Having an Oxygen Plasma Treated ITO Conductive Layer and a HAT N-Type Organic Compound Layer A glass substrate coated with the ITO having a thickness of about 1000 Å was washed in the same manner as in Example 2. The ITO coated glass substrate was plasma treated for five minutes in a plasma cleaner by using an oxygen under a pressure of about 14 mtorr and a power of about 50 W. The work function of ITO was about 5.2 eV.

The HAT of about 500 Å was thermally deposited on the ITO under vacuum to form a transparent anode having an ITO conductive layer and a HAT n-type organic compound layer. The HOMO energy of the HAT was about 9.78 eV. Then, the 4,4'-bis[N-(1-naphthyl)-N-phenylamino]biphenyl (NPB) having a thickness of about 400 Å and the HOMO energy of about 5.4 eV was vacuum-deposited to form a p-type hole transporting layer. The Alq3 having the HOMO energy of about 5.7 eV and the thickness of about 300 Å was vacuum-deposited on the p-type hole transporting layer to form an emitting layer.

The chemical compound represented by Chemical Formula I, which had the HOMO energy of about 5.7 eV and the thickness of 200 Å, was vacuum-deposited on the emitting layer to form an electron transporting layer.

[Chemical Formula I]

The LiF thin film having a thickness of about 12 Å and the Al having a thickness of about 2500 Å were vacuum-deposited on the electron transporting layer to form a cathode. The vacuum deposition rates of the organic compounds, the LiF, the Al were about 0.4 to 0.7 Å/sec, about 0.3 Å/sec, and about 2 Å/sec, respectively. The vacuum level of the vacuum deposition was about $2 \times 10^{-7}$ to $5 \times 10^{-8}$ torr.

Example 5

Organic Luminescence Device Including an Anode Having a Nitrogen Plasma Treated ITO Conductive Layer and a HAT N-Type Organic Compound Layer The glass substrate was washed and plasma treated in the same manner as in Example 2. The ITO having a work function of about 4.8 eV was formed on the glass substrate. The organic compound layer and the cathode were formed on the glass substrate on which the ITO conductive layer was formed in the same manner as in Example 4.

Example 6

Organic Luminescence Device Including an Anode Having an Al Conductive Layer and a HAT N-Type Organic Compound Layer The glass substrate was prepared after washed in the same manner as in Example 3. The Al having a thickness of about 100 Å was vacuum deposited on the glass substrate. The Al was semi-transparent and had work function of about 4.2 eV. The organic compound layer and the cathode were formed on the glass substrate on which the Al conductive layer was formed in the same manner as in Example 4.

Example 7

Organic Luminescence Device Including an Anode Having an Ag Conductive Layer and a HAT N-Type Organic Compound Layer The glass substrate was prepared after washed in the same manner as in Example 3. The Ag having a thickness of about 100 Å was vacuum deposited on the glass substrate. The Ag was semi-transparent and had work function of about 4.2 eV. The organic compound layer and the cathode were formed on the glass substrate on which the Ag conductive layer was formed in the same manner as in Example 4.

Figure 13:
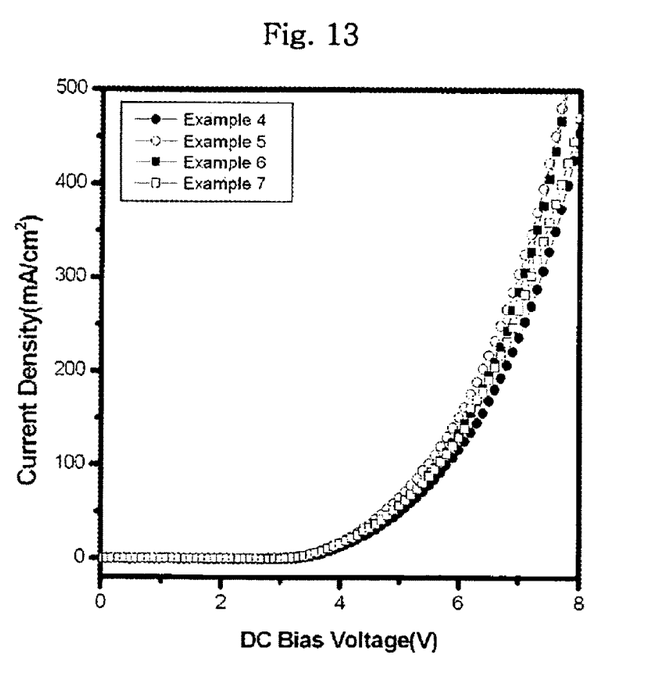
FIG. 13 is a graph showing the current-voltage characteristics of Examples 4 to 7.

FIG. 13 is a graph showing current-voltage characteristics of the organic luminescence devices of Examples 4 to 7. The conductive layers of the organic luminescence devices of Examples 4-7 had the work functions of about 5.2 eV, about 4.8 eV, about 4.2 eV, and about 4.2 eV, respectively. Although the devices of Examples 4-7 had different work functions, the current-voltage characteristics thereof were similar to each other. Therefore, the current-voltage characteristics of the devices did not depend on the value of the work function.

Table 1 shows the brightness of the devices of Examples 4-7, with respect to the current density and the voltage. The devices of Examples 6 and 7, which had the Al and Ag conductive layers, respectively, had visible light transmission of less than about 30% and less than about 50%, respectively, which was lower than that (more than 80%) of the devices having the ITO conductive layer. Therefore, the brightness of the devices having the Al or Ag conductive layer would be equivalent to that of the devices having the ITO conductive layer in considering the visible light transmission rate

TABLE 1

| Current density | 50 mA/cm² | | 100 mA/cm² | |
| --- | --- | --- | --- | --- |
| | Voltage | Brightness | Voltage | Brightness |
| Example 4 | 5.12 V | 1616 cd/m² | 5.85 V | 3326 cd/m² |
| Example 5 | 4.82 V | 1628 cd/m² | 5.57 V | 3323 cd/m² |
| Example 6 | 4.93 V | 1035 cd/m² | 5.67 V | 2138 cd/m² |
| Example 7 | 4.87 V | 1170 cd/m² | 5.67 V | 2443 cd/m² |

As shown in Table 1, the holes were easily transported to the hole transporting layer through the LUMO energy of the n-type organic compound layer. When the LUMO energy of the n-type organic compound layer had about 5.54 to 6.02 eV and the energy difference between the LUMO energy of the n-type organic compound layer and the work function of the conductive layer was about 2 eV or less, the current-voltage characteristics of the organic luminescence devices were independent from the value of the work function of the conductive layer. The energy differences between the LUMO energy of the n-type organic compound layer and the work function of the conductive layer in the devices of Examples 4 to 7 were about 0.24 to 0.82 eV, about 0.64 to 1.22 eV, about 1.24 to 1.82 eV, and about 1.24 to 1.82 eV, respectively.

Example 8

Organic Luminescence Device Including an Al Conductive Layer and a HAT N-Type Organic Compound Layer A glass substrate was prepared in the same manner as in Example 3. The Al having a thickness of about 100 Å was vacuum deposited on the glass substrate. The Al was semi-transparent and had the work function of about 4.2 eV. The HAT having the HOMO energy of about 9.78 eV and the thickness of about 500 Å were heat and vacuum deposited on the glass substrate, on which the Al conductive layer was formed, to form the anode having the Al conductive layer and the HAT n-type organic compound layer.

Then, the 4,4'-bis[N-(1-naphthyl)-N-phenylamino]biphenyl (NPB) having a thickness of about 600 Å and the HOMO energy of about 5.46 eV was vacuum deposited to form a p-type hole transporting layer. The Alq3 having the HOMO energy of about 5.62 eV and the thickness of about 300 Å was vacuum deposited on the hole transporting layer to form an electron transporting layer and an emitting layer. The LiF thin film having a thickness of about 12 Å and the Al having a thickness of about 2500 Å were sequentially vacuum deposited on the electron transporting layer and the emitting layer to form a cathode.

The vacuum deposition rates of the organic compounds, LiF, and the aluminum were about 0.4 to 0.7 Å/sec, about 0.3 Å/sec, and about 1-2 Å/sec, respectively. The vacuum level of the vacuum deposition was about $2 \times 10^{-7}$ to $5 \times 10^{-8}$ torr.

Comparative Example 3

A glass substrate was prepared in the same manner as in Example 3. The Al having a thickness of about 100 Å was vacuum deposited on the glass substrate to form an Al conductive layer. The Al was semi-transparent and had work function of about 4.2 eV. The copper phthalocyanine (CuPc) having the HOMO energy of about 5.20 eV and the thickness of about 150 Å was heat and vacuum deposited on the glass substrate, on which the Al conductive layer was formed, to form a hole injection layer.

Then, the 4,4'-bis[N-(1-naphthyl)-N-phenylamino]biphenyl (NPB) having a thickness of about 600 Å and the HOMO energy of about 5.46 eV was vacuum deposited to form a p-type hole transporting layer. The Alq3 having the HOMO energy of about 5.62 eV and the thickness of about 300 Å was vacuum deposited on the hole transporting layer to form an electron transporting layer and an emitting layer. The LiF thin film having a thickness of about 12 Å and the Al having a thickness of about 2500 Å were sequentially vacuum deposited on the electron transporting layer and the emitting layer to form a cathode.

The vacuum deposition rates of the organic compounds, the LiF, and the aluminum were about 0.4 to 0.7 Å/sec, about 0.3 Å/sec, and about 1-2 Å/sec, respectively. The vacuum level of the vacuum deposition was about $2 \times 10^{-7}$ to $5 \times 10^{-8}$ torr.

Comparative Example 4

An organic luminescence device was fabricated in the same manner as in Comparative Example 3 except for the absence of forming the CuPc hole injection layer. The work function of the conductive material of Example 8 and the work function of the anodes of the Comparative Examples 3-4 were the same, that is, about 4.2 eV.

Figure 14:
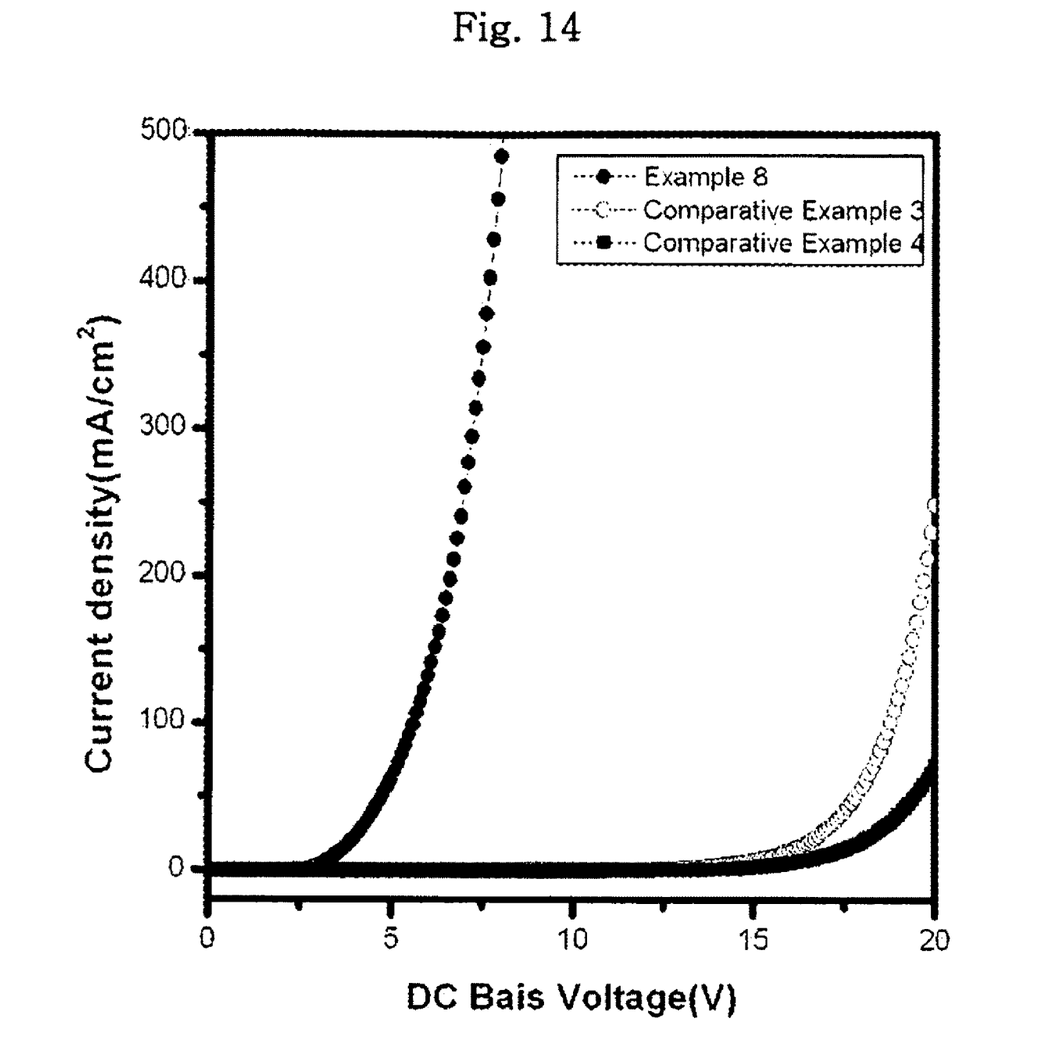
FIG. 14 is a graph showing the current-voltage characteristics of Example 8 and Comparative Examples 3-4.

The device of Example 8 used the HAT having electron affinity as the n-type organic compound layer of the anode, while the devices of Comparative Examples 3-4 did not have the n-type organic compound layer in the anodes thereof. FIG. 14 is a graph showing current-voltage characteristics of Example 8 and Comparative Examples 3-4.

Referring to FIG. 14, the device of Example 8 showed an increased current density at about 5 V, while the devices of the Comparative Examples 3-4 showed no increased current density at about 5 V. Table 2 shows brightness of the devices of Example 8 and Comparative Examples 3-4, with respect to green-luminescence of Alq3.

| Current density | 50 mA/cm² | | 100 mA/cm² | |
|---|---|---|---|---|
| | Voltage | Brightness | Voltage | Brightness |
| Example 8 | 4.8 V | 642.0 cd/m² | 5.6 V | 1316.0 cd/m² |
| Comparative Example 3 | 17.7 V | 15.4 cd/m² | 18.3 V | 31.9 cd/m² |
| Comparative Example 4 | 19.9 V | 21.9 cd/m² | 20.5 V | 47.1 cd/m² |

As shown in Table 2, the device of Example 8, in which the anode included the Al conductive layer and the HAT n-type organic compound layer, showed higher brightness at a low voltage, while the devices of the Comparative Examples 3-4, in which the anode only included the conductive layer, showed much lower brightness at the same voltage. This was because the energy barrier between the Al conductive layer and the CuPc hole injection layer was too big to inject holes in the devices of Comparative Examples 3-4.

Example 9

Organic Luminescence Device Including an Anode Having an ITO Conductive Layer and a F4TCNQ N-Type Organic Compound Layer A glass substrate was prepared in the same manner as in Example 2. The ITO having the work function of about 4.8 eV was vacuum deposited on the glass substrate. The F4TCNQ having the LUMO energy of about 5.24 eV and the thickness of about 360 Å was vacuum deposited on the glass substrate, on which the ITO conductive layer was formed. Therefore, an anode was formed.

Then, the 4,4'-bis[N-(1-naphthyl)-N-phenylamino]biphenyl (NPB) having a thickness of about 400 Å and the HOMO energy of about 5.46 eV was vacuum deposited to form a p-type hole transporting layer. The Alq3 having the HOMO energy of about 5.62 eV and the thickness of about 500 Å was vacuum deposited on the hole transporting layer to form an electron transporting layer and an emitting layer. The LiF thin film having a thickness of about 12 Å and the Al having a thickness of about 2500 Å were sequentially vacuum deposited on the electron transporting layer and the emitting layer to form a cathode.

The vacuum deposition rates of the organic compounds, the LiF, and the Al were about 0.4 to 0.7 Å/sec, about 0.3 Å/sec, and about 1-2 Å/sec, respectively. The vacuum level of the vacuum deposition was about $2 \times 10^{-7}$ to $5 \times 10^{-8}$ torr. When a forward electric field of about 8V was applied to a portion between the anode and the cathode of the device of Example 9, the current density of the device was about 198 mA/cm². The green-luminescence of Alq3 was observed through the anode having the ITO conductive layer and the F4TCNQ n-type organic compound layer.

Example 10

Organic Luminescence Including an Anode Having an Al Conductive Layer and a F4TCNQ N-Type Organic Compound Layer A glass substrate was prepared in the same manner as in Example 3. The Al having a thickness of about 100 Å and a work function of about 4.2 eV was vacuum deposited on the glass substrate to form the conductive layer of the anode. The Al was semi-transparent. The F4TCNQ was formed on the Al conductive layer to form the anode having the Al conductive layer and the F4TCNQ n-type organic compound layer in the same manner as in Example 9. Then, a hole transporting layer, an electron transporting layer, and an emitting layer were formed sequentially, as described in Example 9.

When a forward electric field of about 8V was applied to a portion between the anode and the cathode of the device of Example 9, the current density of the device was about 190 mA/cm². The green-luminescence of Alq3 was observed through the anode having the Al conductive layer and the F4TCNQ n-type organic compound layer. Although the work function of the conductive layer of Example 10 was different from that of Example 9, the green-luminescence was also observed in the device of Example 10.

Comparative Example 5

An organic luminescence device was fabricated in the same manner as in Example 9 except for forming an anode having ITO/Alq3, rather than an anode having ITO/F4TCNQ. That is, the Alq3 having the LUMO energy of about 2.85 eV and a thickness of 500 Å was formed on the ITO conductive layer.

When a forward electric field of about 8V was applied to at an interface between the anode and the cathode of the device of Comparative Example 5, the current density of the device was about $10^{-2}$ mA/cm². The green-luminescence of Alq3 was not observed.

The electrons or holes were not formed at the interface between the Alq3 and NPB hole transporting layer, because the energy difference (about 2.61 eV) between the LUMO energy (about 2.85 eV) of Alq3 and the HOMO energy (about 5.46 eV) of the NPB hole transporting layer was too big. On the contrary, the devices of Examples 9 and 10 in which the anode included the F4TCNQ n-type organic compound layer and the ITO or Al conductive layer, showed high brightness. In the devices of the Examples 9 and 10, the energy difference between the Fermi energy (about 4.8 eV) of the ITO conductive layer or the work function (about 4.2 eV) of the Al conductive layer and the LUMO energy (about 5.24 eV) of the F4TCNQ n-type organic compound layer was about 0.44 eV to 1.04 eV and the energy difference between the HOMO energy of the NPB hole transporting layer and the LUMO energy (about 5.24 eV) of the F4TCNQ n-type organic compound layer was about 0.22 eV.

Example 11

Organic Solar Battery

A glass substrate coated with ITO having a thickness of about 1000 Å was ultrasonically washed for thirty minutes in a distilled water in which a detergent was melted. Corning 7059 glass was used as the glass substrate, and the product 15-333-55 manufactured by Fischer Co. was used as the detergent. Then, the glass substrate was further ultrasonically washed in the distilled water for five minutes, which was repeated twice.

After washing, the glass substrate was sequentially ultrasonically washed in an isopropyl alcohol solvent, an acetone solvent, and a methanol solvent, and then dried. Then, the ITO coated glass substrate was treated by plasma for five minutes in a plasma cleaner by using nitrogen plasma under a pressure of about 14 mtorr and a power of about 50 W. The work function of ITO was 4.8 eV.

The HAT of about 200 Å was thermally deposited on the ITO transparent electrode under vacuum to form an anode having an ITO conductive layer and a HAT n-type organic compound layer. Then, the CuPc having a thickness of about 400 Å and a HOMO energy of about 5.20 eV was vacuum-deposited to form a p-type electrons donor layer.

A fullerene ($C_{60}$) having a thickness of about 400 Å, a HOMO energy of about 6.20 eV and a LUMO energy of about 4.50 eV was vacuum deposited on the p-type electron donor layer to form an electron accepter layer. The 2,9-dimethyl-4,7-diphenyl-1,10-phenanthroline (BCP) having a thickness of about 100 Å, a HOMO energy of about 7.00 eV, and a LUMO energy of about 3.50 eV was vacuum deposited on the electron acceptor layer to form an exciton blocking layer. The exciton blocking layer improved the effectiveness of an organic solar battery.

The LiF having a thickness of about 5 Å and the Al having a thickness of about 2500 Å were sequentially vacuum deposited on the exciton blocking layer to form a cathode. The vacuum deposition rates of the organic compounds, the LiF, and the Al were about 0.4 to 0.7 Å/sec, about 0.3 v/sec, and about 2 Å/sec, respectively. The vacuum level of the vacuum deposition was about $2 \times 10^{-7}$ to $5 \times 10^{-8}$ torr.

The I-V curve of the solar battery was measured by illustrating the light emitted from Xenon lamp to the solar battery, and the efficiency of the solar battery was measured by using the I-V curve. The efficiency of the solar battery was calculated by dividing the maximum multiplication values of the current and the voltage by the energy value of the illustrated light. The solar battery of the Example 11 had an efficiency of about 0.36%.

Example 12

Organic Solar Battery

An organic solar battery was fabricated in the same manner as in Example 11 except for depositing the HAT n-type organic compound layer having a thickness of about 400 Å. The solar battery of Example 12 had an efficiency of about 0.45%.

Comparative Example 6

An organic solar battery was fabricated in the manner as in Example 11 except for the absence of the HAT n-type organic compound layer. The solar battery of Comparative Example 6 showed an efficiency of about 0.04%. The organic solar batteries of Examples 11 and 12, in which the anode included both the ITO conductive layer and the HAT n-type organic compound layer, showed a high efficiency, while the organic solar battery of Comparative Example 6, in which the anode included only the ITO conductive layer, showed a low efficiency.

Electronic devices according to exemplary embodiments of the present invention include an n-type organic compound layer in addition to a conductive layer as an electrode for hole injection or hole extraction. The n-type organic compound layer is chosen so that the energy difference between the LUMO energy of the n-type organic compound layer and the Fermi energy of the conductive layer which contacts one side of the n-type organic compound layer is about 2 eV or less and the energy difference between the LUMO energy of the n-type organic compound layer and the HOMO energy of the p-type organic compound layer which contacts the other side of the n-type organic compound layer is about 1 eV or less. Because the n-type organic compound layer lowers the energy barriers for hole injection or hole extraction and forms an NP junction between the n-type organic compound layer and the p-type organic compound layer, the electronic devices can use various materials as electrodes, thereby simplifying a process and improving efficiency.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to a particular embodiment disclosed as the best mode contemplated for carrying out this disclosure, but that the disclosure will include all embodiments falling within the scope of the appended claims.

What is claimed is:

1. An organic transistor comprising:
   a source electrode;
   a drain electrode;
   a gate;
   an insulating layer disposed on the gate;
   a p-type organic compound layer disposed on the insulating layer; and
   an n-type organic compound layer disposed between the source electrode or the drain electrode and the p-type organic compound layer, an NP junction being formed between the n-type organic compound layer and the p-type organic compound layer, wherein an energy difference between a LUMO energy of the n-type organic compound layer and a Fermi energy of the source electrode or the drain electrode is about 2 eV or less and the LUMO energy of the n-type organic compound layer is greater than the Fermi energy of the source electrode or the drain electrode; and wherein an energy difference between the LUMO energy of the n-type organic compound layer and HOMO energy of the p-type organic compound layer is about 1 eV or less, wherein the n-type organic compound layer comprises fluoro-substituted 3,4,9,10-perylenetetracarboxylic dianhydride (PTCDA), cyano-substituted PTCDA, naphthalene-tetracaboxylic-dianhydride (NTCDA), fluoro-substituted NTCDA, cyano-substituted NTCDA, or hexanitrile hexaazatriphenylene (HAT).

* * * * *